United States Patent [19]

Hadley

[11] Patent Number: 5,786,730
[45] Date of Patent: Jul. 28, 1998

[54] VARIABLE GAIN AMPLIFIER PROVIDING SUBSTANTIALLY UNIFORM MAGNITUDE OUTPUT SIGNAL

[75] Inventor: Maxwell Richard Hadley, Lyndhurst, Great Britain

[73] Assignee: Stewart Hughes Limited, Chandlers Ford, Great Britain

[21] Appl. No.: 714,036

[22] PCT Filed: Mar. 8, 1995

[86] PCT No.: PCT/GB95/00503

§ 371 Date: Nov. 6, 1996

§ 102(e) Date: Nov. 6, 1996

[87] PCT Pub. No.: WO95/24767

PCT Pub. Date: Sep. 14, 1995

[30] Foreign Application Priority Data

Mar. 8, 1994 [GB] United Kingdom ............... 9404445

[51] Int. Cl.$^6$ .................... H03G 3/30; H03F 17/00
[52] U.S. Cl. ............. 330/59; 250/214 AG; 330/282; 330/308; 359/194
[58] Field of Search ................ 330/59, 282, 308; 250/214 A, 214 AG; 359/189, 194

[56] References Cited

U.S. PATENT DOCUMENTS

| | | | |
|---|---|---|---|
| 4,314,152 | 2/1982 | Fenk | 250/214 |
| 4,459,475 | 7/1984 | Flint et al. | 250/214 AG |
| 4,498,001 | 2/1985 | Smoot | 250/214 |
| 4,540,952 | 9/1985 | Williams | 330/282 X |
| 4,868,902 | 9/1989 | Sato | 250/332 |
| 4,870,369 | 9/1989 | Bartenstein et al. | 330/308 X |
| 4,939,475 | 7/1990 | Prasse | 330/39 |
| 5,012,202 | 4/1991 | Taylor | 330/284 |

FOREIGN PATENT DOCUMENTS

| | | |
|---|---|---|
| 0262728 | 9/1987 | European Pat. Off. |
| 0359836 | 9/1988 | European Pat. Off. |
| 0430238 | 11/1990 | European Pat. Off. |
| 0433646 | 11/1990 | European Pat. Off. |
| 208278 | 3/1984 | Germany |

OTHER PUBLICATIONS

An Articed entitled "A 50–Mbit/s CMOS Monolithic Optical Receiver", by David M. Pietruszynski et al., IEEE Journal of Solid–State Circuits 23 (1988), No. 6 New York, NY, pp. 1426–1433.

An Article Entitled "Circuit Options Boost Photodiode Bandwidth", by Jerald Graeme, Electrical Design News, 37 (1992), May 21, No. 11, Newton, MA, US, pp. 155–162.

Japanese Patent Abstract 61–41213 (Sumitomo Electric Ind. Lts), dated Feb. 27, 1986.

*Primary Examiner*—James B. Mullins
*Attorney, Agent, or Firm*—Irwin Ostroff; Robert B. Ardis

[57] ABSTRACT

An amplifier circuit (1) is arranged to amplify a signal of variable magnitude from a photodiode (3) having capacitive characteristics. The circuit (1) comprises a first feedback path containing a voltage controlled variable resistor (8) for varying the gain of the amplifier in relation to the magnitude of the signal so as to provide an output signal of substantially uniform magnitude. The first feedback path also contains a capacitor (7) which compensates for adverse effects of reactance in the circuit caused by the capacitance of the photodiode (3) and of the variable resistor (8) in order to optimize the frequency response characteristics of the amplifier. A second feedback path comprising a fixed value resistor (9) becomes operable when the resistance of the first feedback path is large to provide fixed gain amplification of signals received from the photodiode (3).

12 Claims, 1 Drawing Sheet

VARIABLE GAIN AMPLIFIER PROVIDING SUBSTANTIALLY UNIFORM MAGNITUDE OUTPUT SIGNAL

FIELD OF THE INVENTION

The invention relates to an amplifier circuit, and more specifically to a circuit of variable gain for amplifying a signal of variable magnitude so as to provide an output signal of substantially uniform magnitude.

BACKGROND OF THE INVENTION

A photodiode is a convenient means for measuring the intensity of electromagnetic radiation in the visible or infrared regions of the electromagnetic spectrum. Photodiodes have low internal noise which allows measurement of very low light levels, and intrinsically fast response time which allows measurement of very short light pulses. However, the output signal produced by a photodiode exposed to low light levels may be very small and, for this reason it is customary to amplify the photodiode output signals before they are processed further. The signals output from a photodiode have a current proportional over a wide range to the intensity of light falling thereon but most signal processing is applied to signals of variable voltage. It is desirable to be able to convert the current signals output from the photodiode into corresponding voltage signals and therefore a current-to-voltage converter or so-called transimpedance amplifier is commonly used for this purpose. These amplifiers have many desirable properties, including low noise and wide bandwidth, and generally comprise a high gain inverting amplifier, commonly an integrated circuit operational amplifier connected in a virtual earth configuration, with a feedback resistance connected from output to input.

The designing of an optimum current-to-voltage converter, when the maximum output current produced by a photodiode is known, is a matter of routine. Photodiodes are able to operate over such a large range of light levels that no single design of amplifier can be optimum over the entire range. In order to achieve the lowest amplifier circuit noise the feedback resistance should be as large as possible. However, high feedback resistance increases the circuit gain, and at high light levels the amplifier circuit will be unable to handle the maximum signal produced by the photodiode. If the gain is low enough to accommodate the maximum signal that can be produced by the photodiode, the noise from the amplifier circuit will exceed the signal from the photodiode at low light levels.

It is therefore convenient and indeed desirable in many cases to provide an amplifier circuit of variable gain. It is also often desirable that the gain be electronically controllable, for example by making the feedback resistance of the amplifier circuit an electronically controllable element. Various methods of implementing such electronic control are well known.

As is well known to those possessed of the appropriate skills the relationship between a signal input to a linear circuit and a signal output from the circuit can be described by the so-called transfer function of the circuit which may be expressed as the ratio of two complex polynomials in complex frequency S. The dynamic behaviour of the circuit can be determined by examining the closed loop transfer function for mathematical poles and zeros, that is to say values of complex frequency S at which the denominator of the transfer function is zero (i.e. a pole) and at which the numerator is zero (i.e. a zero). Poles in a transfer function are caused by reactive elements (eg. capacitors or inductors) in the circuit and the value of a pole indicates whether the circuit will become unstable and oscillate.

As the feedback resistance of the transimpedance amplifier circuit is varied, its bandwidth also changes. At high gains (large feedback resistance), stray capacitance across the feedback resistance together with capacitance in the photodiode causes a response pole which increasingly limits the maximum high frequency bandwidth of the photodiode and amplifier circuit in combination. At low gains (small feedback resistance) the combined effect of the phase shift of the inverting amplifier and the phase shift caused by the photodiode capacitance and feedback resistance is to introduce in the closed loop transfer function a conjugate pair of poles which cause a peak in the frequency response of the transimpedance amplifier circuit. As the gain is reduced the conjugate pole pair move towards the imaginary axis in the complex frequency plane S and in severe cases the circuit will oscillate. When an amplifier of fixed gain is designed, a small capacitor can be connected in parallel with the feedback resistor in order to achieve optimum bandwidth. The effect of the small capacitor is to introduce a zero into the transfer function of the feedback path which reduces the phase shift at the unity loop gain frequency of the circuit and moves the closed loop conjugate pole pair away from the imaginary axis. The value of the capacitor may be approximately determined from the capacitance of the photodiode, the input capacitance of the inverting amplifier, the open-loop gain/band-width product of the inverting amplifier, and the value of the feedback resistance. The optimum value will also depend on other stray capacitances within the circuit and should be determined empirically. It is not possible to select a single optimum value of, compensation capacitor for a variable gain tramsimpedance amplifier circuit. If the capacitance of the compensation capacitor is too large, the closed loop bandwidth of the amplifier circuit will be reduced unnecessarily, and if it is too small the frequency response of the amplifier circuit will include an unwanted peak. If a fixed value compensation capacitor is used with a variable feedback resistor and the capacitance is not large enough, the circuit will function correctly at both high and low gains but at intermediate gain values as determined by the value of the variable resistance the frequency response will again include unwanted peak or the circuit may even oscillate. The present invention aims to provide an amplifier circuit in which at least some of the foregoing problems are reduced or overcome.

SUMMARY OF THE INVENTION

Accroding to one aspect of the invention there is provided an amplifier circuit comprising an amplifier having an inverting input for receiving signals from a signal source and connected to receive output signals via a first feedback path having a resistance which is variable in inverse proportion to the amplitude of signals from the source such that amplified signals output from the amplifier are of substantially uniform amplitude and via a second feedback path having a fixed resistance and being operable when the resistance of the first feedback path is large to provide fixed gain amplification of signals received from the source.

According to another aspect of the invention there is provided an amplifier circuit for amplifying a signal of variable magnitude from a source having capacitive characteristics the circuit comprising a first feedback path containing an element of variable resistance for varying the gain of the amplifier in relation to the magnitude of the signal so as to provide an output signal of substantially uniform magnitude and containing a reactive element which compensates for effects of reactance in the circuit formed from the capacitance of the source and the element of variable resistance in order to optimise the frequency response characteristics of the amplifier.

The above and further features of the invention are set forth with particularity in the appended claims and together with advantages thereof will become clearer from consideration of the following detailed description of an exemplary embodiment of the invention given with reference to the accompanying drawing.

Figure 1:
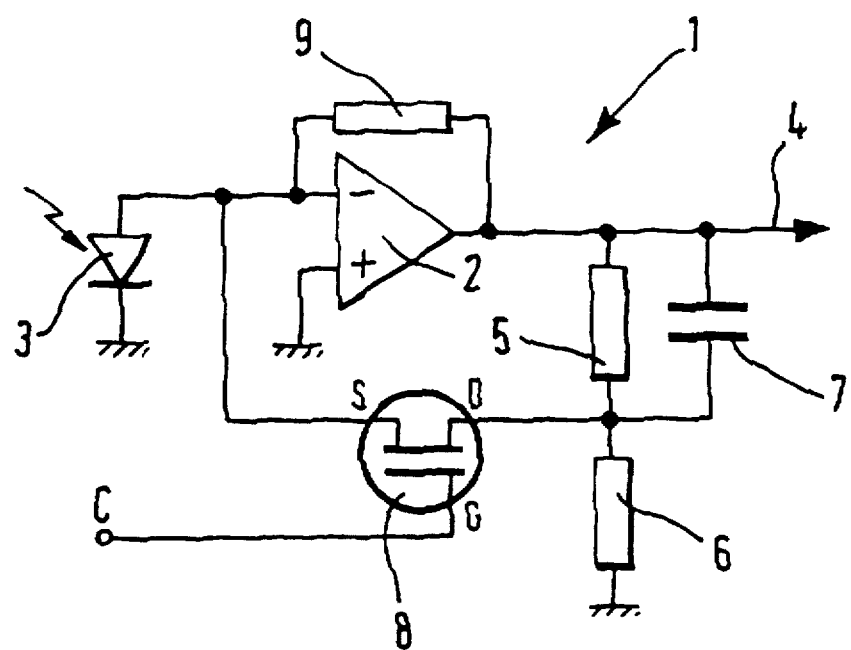
FIG. 1 is a schematic circuit diagram of an amplifier circuit embodying the invention.

Turning now to the accompanying FIG. 1, there is shown an amplifier circuit 1 comprising an operational amplifier 2 whose non-inverting input (+) is connected to circuit ground and whose inverting input (−) is connected to receive signals from a photodiode 3 connected between the inverting input (−) and circuit ground. The photodiode may for example by a Hamamatsu S1336-18BK which has a capacitance of 20pF, and the operational amplifier 2 may for example be an Analog Devices AD645BH which has an input capacitance of 3.5 pF. The operational amplifier 2 serves to convert current signals input from the photodiode 3 into a voltage signal output 4.

The circuit 1 includes two feedback paths from the output 4 of operational amplifier 2 to the inverting input. The first feedback path is of variable resistance in order to enable the gain of the amplifier circuit 1 to be varied, and comprises a potential divider defined by resistors 5 and 6, a capacitor 7 and a field effect transistor (FET) 8. The second feedback path comprises a resistor 9 having a fixed value chosen to give the maximum gain possible for a desired bandwidth.

The FET 8, which may for example be a Siliconix 3N163, serves as a voltage variable resistor whose resistance between source S and drain D is controlled by a control voltage C applied to the gate G. In order to ensure that the FET 8 operates in its resistive region the voltage applied between the source S and drain D must be kept small. The values of the resistors 5 and 6 are therefore selected so that the drain D is presented with a small fraction of the voltage of the output 4 from the amplifier. Typically, the potential divider comprising the two resistors 5 and 6 may present one eleventh of the amplifier output voltage to the drain. Resistance values of 1KΩ and 100Ω are suitable for resistors 5 and 6 respectively. The potential divider causes the feedback current input to the inverting input (−) from the first feedback path to be reduced proportionally, giving the effect of an input-to-output feedback resistance 11 times larger (for example) than the resistance between the drain D and the source S of the FET 8.

By varying the gate voltage of the FET 8, the effective feedback resistance of the first feedback path is made to vary over a wide range, thereby varying the overall gain of the circuit 1. The control voltage C applied to the gate G can be determined by any suitable means and may for example be derived from ambient light levels for example as indicated by the magnitude of the signal from the photodiode 3 or another photodiode or other light sensitive device (not shown) independent from the photodiode.

The photodiode 3 has a capacitance and the FET 8 has an input common source capacitance ($C_{iss}$) which capacitances, together with the drain D to source S resistance of the FET 8 serve to create a pole in the open loop transfer function of the feedback path of the circuit 1. The open loop gain of the amplifier 2 falls with frequency but the pole in the open loop transfer function of the feedback paths can cause instability in the operation of the amplifier circuit 1. As the drain D to source S resistance of the FET 8 is varied by the control voltage C the frequency of the pole is also varied. The FET 8 has reverse transfer common source capacitance ($C_{rss}$) which together with capacitance in the resistor 9 serves to compensate for the effect of the pole in the open loop transfer function of the feedback paths at high and low gain values. However, at intermediate gain values the effect of the pole is to cause an unwanted peak in the gain characteristics of the circuit.

The capacitor 7 connected across resistor 5 is provided in order to overcome, or at least reduce, the aforementioned problems by providing a phase lead to the feedback voltage applied to the drain D of the FET 8. The phase lead is chosen to cancel out the phase shift associated with the pole produced by the FET drain to source resistance and the photodiode input capacitance over the range of gain values at which the aforementioned unwanted peak occurs. The exact value of the capacitor 7 is not critical, because the ratio of resistors 5 and 6 ensure an effective frequency range for the compensation of at least a frequency decade. A capacitor of 10 nF is suitable. Connecting the capacitor 7 to the potential divider ensures that the capacitor 7 is only effective at lower circuit gains, where it is needed, and does not limit the bandwidth of the amplifier 1 at higher gains.

An undesirable effect of the potential divider defined by resistors 5 and 6 is that it increases the noise gain of the circuit by amplifying the noise from the operational amplifier 2 and the FET 8 by an extra factor of 11, as compared to the noise gain of a direct input to output connection of the same equivalent resistance. This limits the maximum usable gain of the circuit, as determined by the first feedback path, at which the signal from the photodiode 3 is still distinguishable from noise in the amplifier circuit.

The second feedback path comprising the resistor 9 is therefore provided to reduce the noise gain to unity when the amplifier circuit 1 is set for a high gain. As the resistor 9 is connected directly from output to input, it is not affected by the potential divider 5, 6. The value of the resistor 9 is chosen to provide the highest possible gain (and lowest noise) for a desired circuit bandwidth and, for example, a value of 680MΩ is suitable for use with the above mentioned operational amplifier.

As the voltage C on the gate G of the FET 8 is increased the increasing value of drain to source resistance reduces the effect of the first feedback path on the total feedback around operational amplifier 2, causing a corresponding increase in the effect of the second feedback path (resistor 9). In the limit, when the FET 8 is completely off (ie. the drain to source resistance is maximum i.e. effectively infinite), the resistive part of the first feedback path makes no contribution to the voltage applied to the inverting input of the operational amplifier 2. The potential divider comprising resistors 5 and 6 is isolated from the inverting input (−) and thus the noise gain of the amplifier circuit 1 is reduced to unity (ie. it is caused only by the second feedback path) which in turn provides optimum signal to noise ratio at the highest practicable circuit gain. When the level of the signal output from the photodiode 3 increases (as the result of more light falling thereon) there is a corresponding increase in the control voltage C in order to reduce the gain of the amplifier circuit 1. As the control voltage C is increased and FET 8 starts to conduct the signal gain of the amplifier circuit 1 reduces and the noise gain of the circuit rises. However, the increase in signal level from the photodiode is much greater than the increased noise level due to the changed noise gain and thus the signal remains readily discernible from the background noise generated within the circuit 1.

Stray capacitance introduced by other components in the circuit should be minimised in order to allow a large value of maximum feedback resistance which minimises the circuit noise at high gains. Also, the bandwidth of the circuit 1 is limited by stray capacitance across the resistor 9 and in the FET 8. More specifically, since the capacitance $C_{rss}$ of the FET 8 and the stray capacitance of the resistor 9 provide compensation for the feedback pole produced by the resistor 9 and the capacitance $C_{iss}$ of the FET 8 in combination with the capacitance of the photodiode 3 and of the amplifier 2, selecting an FET, a photodiode and an amplifier with low capacitance values allows a high value of resistance to be selected for resistor 9. This gives a circuit with an optimum gainbandwidth product and minimum circuit noise over the desired circuit bandwidth. The above described circuit 1 has a designed bandwidth of 4 kHz which does not rise above a maximum of 15 kHz over a 70 dB gain change. The maximum gain peaking that has been observed in the circuit is 2 dB.

Having thus described the present invention by reference to a preferred embodiment it is to be well understood that the embodiment in question is exemplary only and that modifications and variations such as will occur to those possessed of appropriate knowledge and skills may be made without departure from the spirit and scope of the invention as set forth in the appended claims and equivalents thereof.

I claim:

1. An amplifier circuit comprising:

a signal source;

an amplifier having an inverting input connected to said signal source for receiving signals therefrom, and having an output;

a first feedback path connecting said output to said inverting input, said first feedback path comprising a component of variable resistance, said resistance of said component being variable in inverse proportion to the amplitude of signals from the source such that amplified signals outputted from the amplifier are of substantially uniform amplitude;

a second feedback path connecting said output to said inverting input, said second feedback path being connected in parallel with said first feedback path, and comprising a fixed resistance, said second feedback path being operable when said resistance of said first feedback path is large to provide fixed gain amplification of signals received from the source; and wherein the first feedback path comprises a reactive element in series with said component, said reactive element introducing a phase lead to a feedback signal transmitted over said first feedback path.

2. An amplifier circuit as claimed in claim 1, wherein said component of variable resistance in said first feedback path comprises a voltage controlled resistor.

3. An amplifier circuit as claimed in claim 2, wherein said voltage controlled resistor comprises a field effect transistor.

4. An amplifier circuit as claimed in claim 3, wherein said first feedback path comprises an attenuator for attenuating the output signal before the same is applied to said field effect transistor.

5. An amplifier as claimed in claim 4, wherein said attenuator in said first feedback path comprises a potential divider.

6. An amplifier as claimed in claim 1, wherein said amplifier comprises an operational amplifier.

7. An amplifier circuit as claimed in claim 1, wherein said signal source comprises a photodiode.

8. An amplifier circuit as claimed in claim 1, wherein said reactive element in said first feedback path comprises a capacitor.

9. An amplifier circuit for amplifying a signal of variable magnitude from a source having capacitive characteristics, the circuit comprising:

an amplifier having an input, an output, a frequency response and a gain;

a first feedback path between said output and said input of said amplifier;

an element of variable resistance in said first feedback path, said element of variable resistance having a resistance that varies said gain of said amplifier in relation to said magnitude of said signal so as to cause said amplifier to provide at said output an output signal of substantially uniform magnitude, a second feedback path between said output and said input of said amplifier, said second feedback path comprising a fixed resistance which defines a maximum gain of said amplifier when said resistance of said variable resistance element exceeds a predetermined resistance value, and wherein said first feedback path contains a reactive element which compensates for effects of reactance formed from said capacitive characteristics of said source and said element of variable resistance to optimize said frequency response characteristics of said amplifier.

10. An amplifier circuit as claimed in claim 9, wherein said source comprises a photodiode.

11. An amplifier circuit as claimed in claim 9, wherein said element of variable resistance comprises a field effect transistor.

12. An amplifier circuit as claimed in claim 11, wherein said first feedback path comprises a potential divider for reducing said magnitude of said signal conveyed through the field effect transistor.

* * * * *